United States Patent [19]

Higgs et al.

[11] Patent Number: 4,578,692
[45] Date of Patent: Mar. 25, 1986

[54] INTEGRATED CIRCUIT WITH STRESS ISOLATED HALL ELEMENT

[75] Inventors: Jacob K. Higgs, Concord, N.H.; John Humenick, Shrewsbury, Mass.

[73] Assignee: Sprague Electric Company, North Adams, Mass.

[21] Appl. No.: 600,875

[22] Filed: Apr. 16, 1984

[51] Int. Cl.$^4$ ...................... H01L 27/22; H01L 27/04
[52] U.S. Cl. ........................................ 357/27; 357/48
[58] Field of Search ..................................... 357/27, 48

[56] References Cited

U.S. PATENT DOCUMENTS

| | | | |
|---|---|---|---|
| 3,117,260 | 1/1964 | Noyce | 357/48 |
| 3,547,716 | 12/1970 | DeWitt et al. | 357/34 |
| 3,564,443 | 2/1971 | Nagata | 357/48 |
| 3,576,475 | 4/1971 | Kronlage | 357/48 |
| 3,816,766 | 6/1974 | Anselmo et al. | 357/27 |
| 4,123,772 | 10/1978 | Janssen | 357/27 |
| 4,141,026 | 2/1979 | Bate et al. | 357/27 |
| 4,253,107 | 2/1981 | MacDougall | 357/27 |

OTHER PUBLICATIONS

*IBM Journal*, 1966, Kennedy et al., "Calculations of Impurity Atom Diffusion . . . ", pp. 6–12.
*Physical Review*, vol. 94, No. 1, Apr. 1, 1954, Smith, C. S., "Piezoresistance Effects in Ge. and Si.", pp. 42–49.
Ravi, *Imperfections and Impurities in Semiconductor Silicon*, J. Wiley & Sons, N.Y., 1981.

*Primary Examiner*—Martin H. Edlow
*Assistant Examiner*—J. Jackson

[57] ABSTRACT

A silicon integrated circuit includes a centrally located Hall element having an annular moat region surrounding the Hall element to isolate it from built in stresses in adjacent parts of the integrated circuit. The moat comprises at least one annular isolation wall, but preferably two concentric isolation walls. This moat construction also leads to a reduction in dependency of Hall element symmetry upon process variables.

10 Claims, 7 Drawing Figures

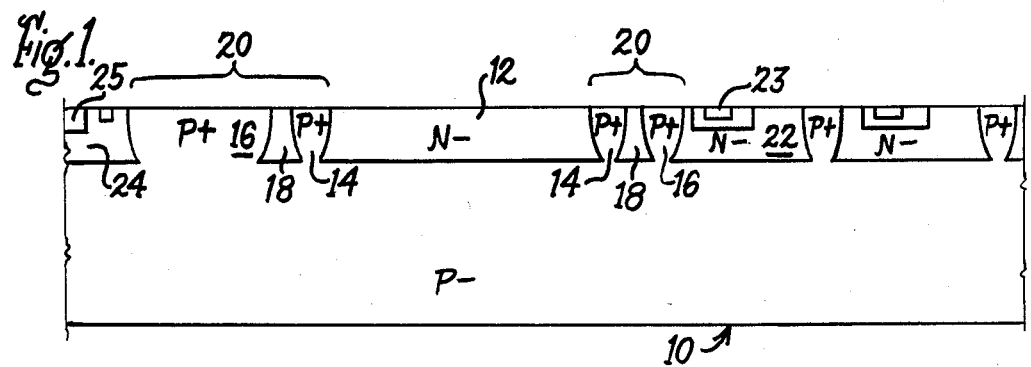
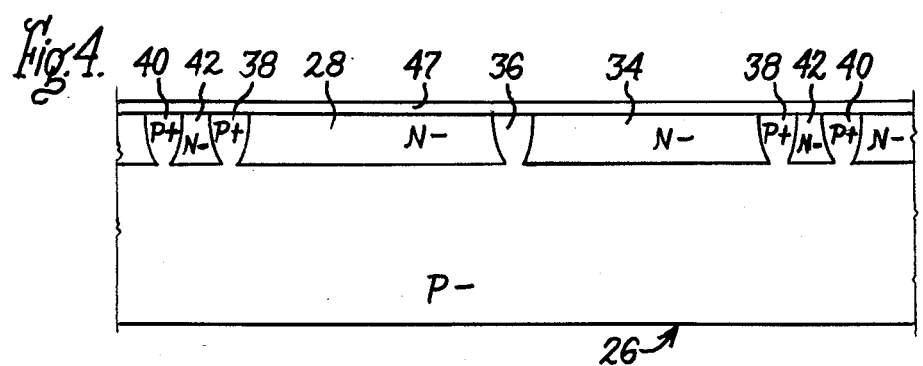
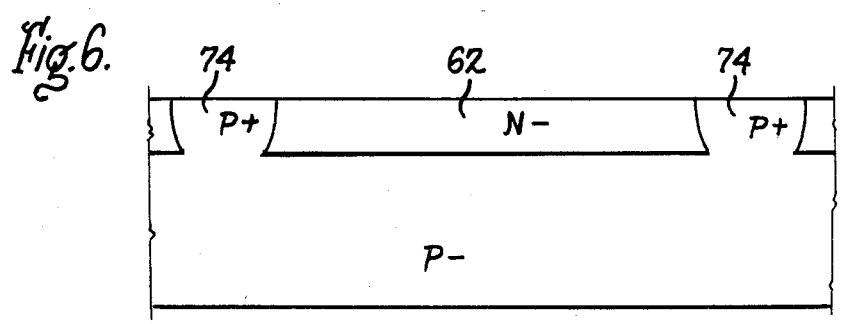
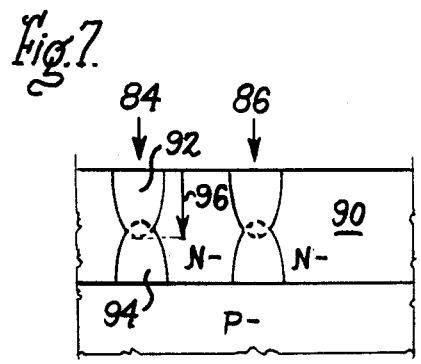
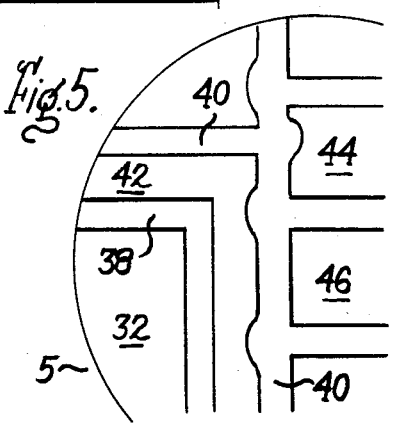

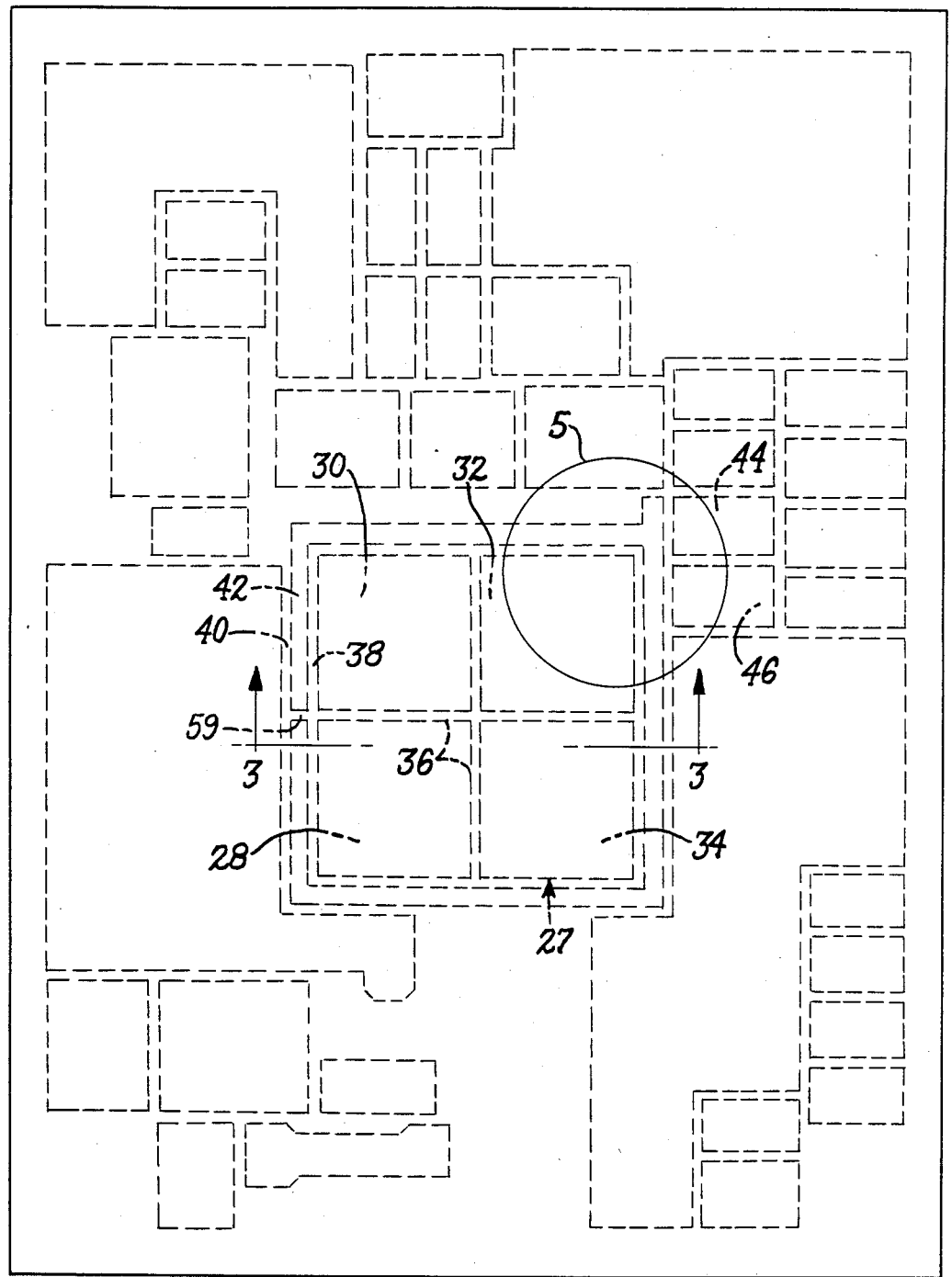

INTEGRATED CIRCUIT WITH STRESS ISOLATED HALL ELEMENT

BACKGROUND OF THE INVENTION

This invention relates to an integrated circuit chip including a Hall element, and more particularly to an integrated circuit Hall element having a surrounding barrier that buffers chip stresses that reduce certain process dependent factors which tend to distort Hall element symmetry and contribute to the Hall element offset voltage.

Integrated circuits including Hall elements are well known. In a silicon integrated circuit the Hall element has a low sensitivity, and other portions of the IC usually contain a differential amplifier for amplifying the low value output voltage from the two sensing or output contacts of the Hall element. For example in the patent to Anselmo and Genesi U.S. Pat. No.3,816,766 issued June 11, 1974, and in the patent to Macdougall U.S. Pat. No. 4,253,107 issued February 24, 1981, both assigned to the same assignee as the present invention, such integrated circuits containing Hall elements are described in detail.

The Hall element output voltage is used as a measure of the ambient magnetic field. For example, a magnet is mounted to the integrated circuit whose output is responsive to the presence of or movement of a ferromagnetic body. Such a proximity detector is described by Avery in U.S. Pat. No. 4,443,716 issued April 17, 1984 and also assigned to the same assignee.

The reduction and control of the Hall element offset voltage has been the object of much attention, and especially the silicon integrated circuit Hall element that is followed by an on-board differential amplifier. It has been found that symmetry in the Hall element is fundamentally essential in order to provide a low offset voltage. An operating symmetry can be achieved by constructing a Hall element of an array of Hall cells that are arranged to have radially directed exciting currents with cell output voltages connected in parallel. Even when a Hall element has such symmetry, there often remains a troublesome offset voltage whose origin is not known or controllable.

It is therefore an object of the present invention to provide an integrated circuit including a Hall element having a unique structural barrier to built in chip stresses.

It is a further object of this invention to provide such an integrated circuit that has a Hall element whose offset voltage is less influenced by the layout of surrounding components and by process variables.

SUMMARY OF THE INVENTION

This invention recognizes that stresses are inevitably built into an integrated circuit during fabrication, and a Hall element disposed therein is subject to their contribution to Hall offset voltage. Such stresses are generally not imposed on the Hall element in a symmetrical pattern.

When an integrated Hall element having a high degree of operational symmetry has been made either by fine geometry control or by arranging an array of Hall cells in a symmetrical manner or by other means, the above-noted built in stresses can become a dominant source of offset voltage.

One aspect of this invention includes a Hall element located about in the middle of the major silicon surface in which the integrated components are formed. Here the built in stresses as influenced by chip edges tend to at least be uniform.

Another aspect of this invention finds an integrated Hall element surrounded by isolated semiconductive pockets of one type conductivity in which other components such as Hall voltage amplifier transistors are located. A wide moat or barrier separates these other pockets from the periphery of the Hall element. Such walls are typically formed either by down diffusion only or by diffusing impurities both upward and downward. The width, or span, of the moat is at least three times the downward extension of the downward diffused portion of the moat.

The moat may be simply one heavily doped isolation wall, in which case its span should be at least four times the depth of the wall, or the depth of its downward diffused portion. However, a moat structure is preferred that includes two concentric PN junction isolation walls, typically spaced apart by about 25 microns.

This moat construction provides a barrier against localized stresses produced by localized points of high dopant concentrations near the Hall element. It also is capable of altogether preventing distortions of the Hall element perimeter due to bulges that occur at intersections of transistor isolation walls and the outer of the two walls of the moat.

BRIEF DECRIPTION OF THE DRAWINGS

FIG. 1 shows in cross-sectional view a first integrated circuit of this invention including a single cell Hall element bound by a stress relieving moat.

FIG. 2 shows in a partially developed plan view a second integrated circuit of this invention including a four cell Hall element bound by a stress relieving moat.

FIG. 4 shows in side-sectional view a portion of the integrated circuit of FIG. 2 including the Hall element and the moat.

FIG. 5 shows a magnified detail of FIG. 2.

FIG. 6 shows in cross sectional view another moat surrounded Hall element in another integrated circuit of this invention.

FIG. 7 shows in side-sectional view a magnified detail portion of a moat in yet another integrated circuit of this invention.

DESCRIPTION OF THE PREFERRED EMBODIMENTS

Figure 3:
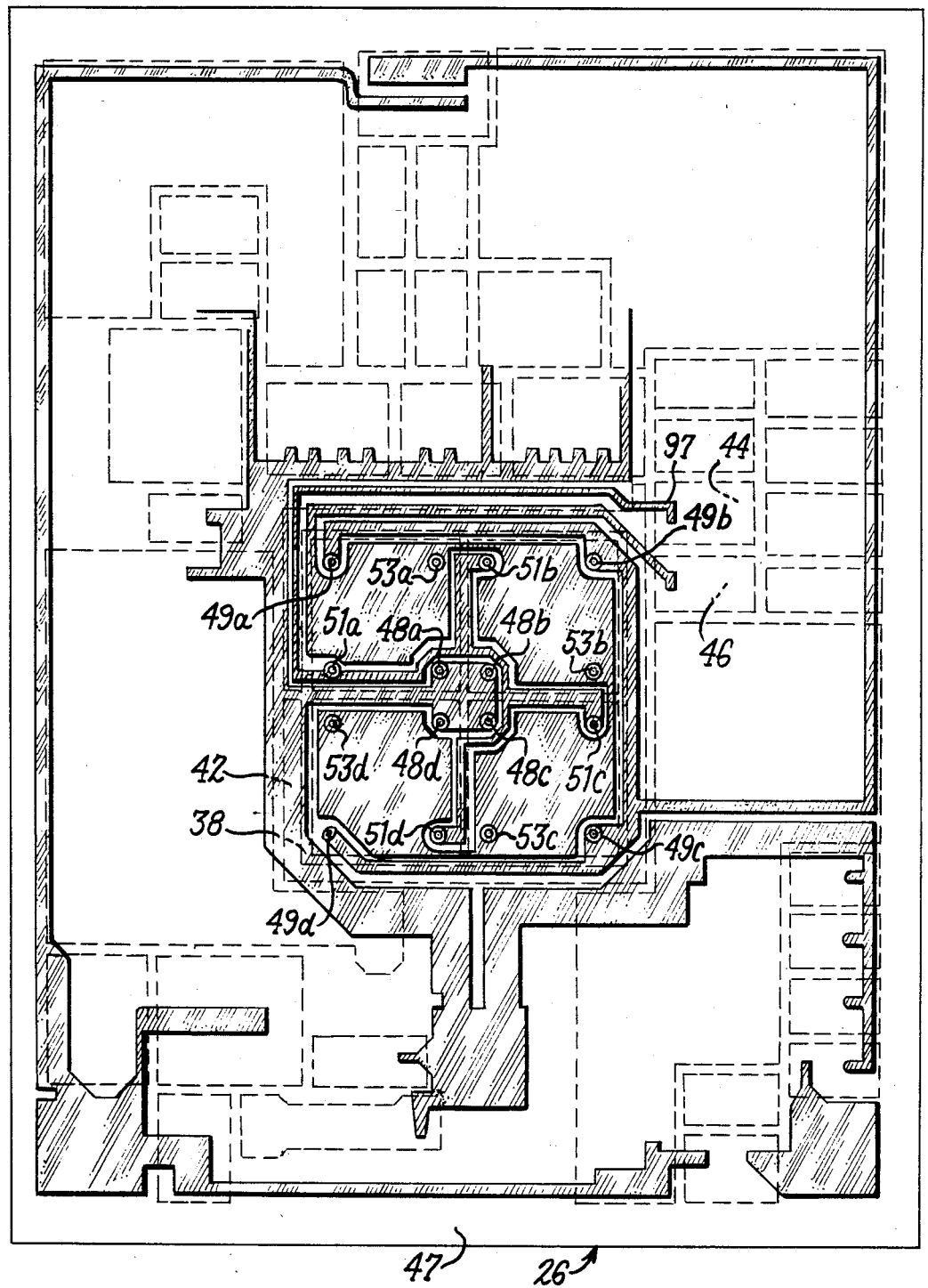
FIG. 3 shows a more fully developed plan view of the integrated circuit of FIG. 2 that includes a network of metal conductors overlying the Hall element.

An integrated circuit chip 10, illustrated in cross section in FIG. 1, includes a Hall element 12 formed in a lightly N-doped epitaxial pocket that is circumscribed by a heavily P-doped isolation wall 14. Concentric with and spaced away from Hall element 12 is an outer P-doped isolation wall 16. Together these two walls 14 and 16, including N-epitaxial band 18 sandwiched between walls 14 and 16, form a moat 20 for reducing unsymmetrical stresses and other unwanted effects on Hall element 12 from the other semiconductor structures adjacent the Hall element 12, as will be further explained below. In epitaxial pocket 22 adjacent Hall element 12 is an NPN transistor 23, and in the partially shown pocket 24 is another NPN transistor 25.

Referring to FIGS. 2,3 and 4, an integrated circuit chip 26 includes a Hall element 27 that is made up of an array of four Hall cells formed in the epitaxial pockets 28, 30, 32 and 34. Those pockets are separated by a cross-shaped system of P+isolation walls 36. This four cell Hall element is surrounded and circumscribed by an annular isolation wall 38. Wall 38 is in turn surrounded by an outer isolation wall 40 that is spaced from and roughly concentric with wall 38. There is left between walls 38 and 40 an N-epitaxial band 42. Adjacent to the Hall element 27 are epitaxial pockets 44, 46 and others. In FIG. 4 an insulative pasivating layer 47 is shown covering the epitaxial surface of the chip 26.

Several structural features of the integrated circuit chip 26 are aimed at minimizing stresses on the Hall element 27 within the chip 26 or at giving symmetry to stresses that tend to contribute to the Hall element output voltage.

Hall element 27 is about centered within chip 26 to avoid stresses associated with the chip edges. It also reduces packaging stresses both flexing and compressing.

Each of the four Hall cells as seen in FIG. 3 has a pair of power contacts 48 and 49 lying in a radial line (not shown) relative to the center of the Hall element 27. These contact pairs 48a–49a, 48b–49b, 48c–49c and 48d–49d are connected in parallel so that, when connected to a DC power source, the Hall element exciting current flows in symmetrical radial directions relative to the center of the Hall element 27. Sensing contacts 51a-53a, 51b-53b, 51c-53c and 51d-53d-, respectively, for each Hall cell are also connected in parallel in such directions that tend to buck out the offset voltages of the Hall cells to minimize the stress induced offset voltage at the output of the Hall element 27.

Furthermore, the Hall element 27 has an epitaxial layer thickness of 17 microns and is surrounded by a moat including an unusually wide region of uniform dopant profile e.g. wall 38 and band 42 totaling 55 microns. This moat occupies more chip real estate than is desirable. The outer moat wall 40 has a width of 10 microns but may be larger where convenient. The inner moat wall 38 and walls 36 are 10 microns wide.

In FIG. 5 a portion of the chip of FIGS. 2 and 3 is magnified and has the surface protective layer 47 removed. The outer wall 40 bulges inward at points where, for example, the isolation walls 55 and 57, which are for further defining the transistor pockets 44 and 46, intersect wall 40. These bulges are the result of a greater lateral diffusion into the epitaxial band 42 due to the increase in those intersecting-wall locations of P-dopant concentration.

This phenomenon is explored and discussed quantitatively by D.P. Kennedy and P.C. Murley in the paper calculations Of Impurity Atom Diffusion Through A Narrow Diffusion Mask Opening, IBM Journal, January 1966.

Thus the protective moat of this invention, and more particularly the epitaxial band 42, absorbs the geometry distorting effects of structures built adjacent the Hall element 27, instead of the Hall element itself that would be so distorted in the absence of the moat. Such physical distortions of the Hall sensor will of course unbalance a perfectly balanced Hall element and increase the offset voltage. The integrated circuit designer is therefore free to place other integrated circuit components anywhere about the moat protected Hall elements.

Furthermore, the inevitable variations in process parameters, e.g. those relating to isolation wall diffusions, from chip to chip in a wafer or from wafer to wafer are no longer a factor in determining the offset voltage by various degrees of physical distortion of the Hall element.

Yet another mechanism by which the moat minimizes offset voltage is by means of more symmetrically distributing stresses in the chip.

If there were no moat and inward directed bulges existed in the conventional narrow isolation wall defining the boundries of the Hall element, Hall offset voltages would be generated by stresses at the bulges induced by more intense distortion of the silicon crystal lattice there. This would occur as a result of the localized spots (at the bulges) of higher dopant concentration. This phenomenon is thought to result from a further expansion (or contraction) of the lattice where impurity atoms of greater (or smaller) size than silicon are concentrated. See for example the book by K.V. Ravi entitled Imperfections and Impurities In Semiconductor Silicon, John Wiley and Sons, page 343.

A conventional Hall element having such stresses imposed at its periphery will be subjected to a piezoresistive change at such localized points. See the paper by C. S. Smith, Piezoresistance Effect In Germanium and Silicon, Physical Review, Vol, 94, No. 1, Apr. 1, 1954 pp 42-38. The moat structure of this invention serves to space such stress points further away from the Hall element and reduce their effect.

It may be desirable to reduce the resistance between the isolation walls 36 that separate the four Hall cells and the outer wall 38. A P+bridge 59 may be formed between the inner and outer isolation walls 38 and 40 for that purpose. The bridge 59 is located near the Hall-cell-separating walls 36 between two Hall-cell pockets 28 and 30, and near the power contacts 51a and 53d, so that any stresses generated by the bridge 59 will tend to affect these two Hall-cells nearly the same way and at least stress sensitive Hall cell region. Their respective offset voltages from that stress will tend to be small and also to cancel out.

The bridge 59 may be formed at the same time that the walls themselves are formed, actually forming another wall there. Or, the bridge may be formed of B and R dopant when the bases of the transistors and the diffused resistors are formed.

As an alternative to the bridge 59 in the moat of FIG. 2, a P+buried layer (not shown) may be formed at the interface of the epitaxial layer and the P-substrate, but this usually requires an added process step. Another way to get better conduction between the walls would be to make contacts (not shown) and join the walls with metal. However, metal contacts tend to relieve built-in stresses of the heavily doped walls and become a source of stress discontinuity. Four bridges (not shown) of the kind 59 that is shown in FIG. 2 may well be better than one if they are each placed at one of the four intersections of the wall 38 and the wall 36, respectively, to obtain another symmetrical pattern.

It would be possible to achieve reduction of the offset voltage by eliminating the epitaxial band (e.g. 18 in FIG. 1 or 42 in FIG. 2) and instead making the whole moat a single extraordinarily wide isolation wall 74 as in FIG. 6. Here a Hall element pocket 62 is bounded by an annular P+isolation wall 74 of extraordinary width e.g. 55 to 80 microns.

However, one disadvantage of such a wide span moat is suggested by the above-noted principle that to add even more crystal distorting impurities at the periphery of the Hall element would result in greater stress yet.

Although such increased stress would likely be just as symmetrical as in the two-wall moat, the degree of stress asymmetry grows in importance where the overall level of stresses increase. Also the single wide P+moat would have to be wider than a two walled moat to give the same protection against Hall element geometry distortions at wall intersections. For these reasons the above-described moat in the embodiment of FIG. 2 including two isolation walls 38 and 40 with an epitaxial band 42 is much preferred.

Referring to FIG. 7 the pair of isolation walls 84,86 that define a moat in yet another integrated circuit are formed by diffusing P-type impurities both downward and upward from the interface between the P-substrate 88 and the N-epitaxial layers 90. The wall 84 is made up of a downward diffused region 92 and upward diffused region 94. The dotted lines indicate the degree of overlapping that exists between the downward and upward diffused regions 92 and 94. Such walls have the advantage that less extensive driving times and temperatures are required to form them, compared with the times and temperatures required to drive impurities all the way through the epitaxial layers as for the structure of FIG. 1. Therefore, it is possible to make narrower isolation walls by this method.

In general it has been calculated that for any thickness of epitaxial layers and however the walls may have been formed, the moat should be at least three times wider than the downward extension, as indicated by arrow 96, of the downward diffused portion 92 of the at least one wall 84. The downward extension of a wall (14 in FIG. 1) that has only a downward diffusion portion will in practice be slightly greater than the epitaxial layer thickness, e.g. the depth of the Hall element 12 in FIG. 1.

Isolated walls that are made by downward and upward diffusion thus advantageously lead to less wide moats but have the usual disadvantage of requiring an additional process step.

In FIG. 3, a network of conductors is shown overlying the passivating layer 47. These conductors are thin aluminum films. For example, conductor 97 connects the Hall cell output contacts 51a,51b,51c and 51d to the base of the amplifier transistor (not shown) in pocket 44. The conductor 99 connects the other output Hall cell contacts 53a,53b,53c, and 53d to the base of the amplifier transistor (not shown) in pocket 46. This conductor 99 also serves another important function. It is made broad over a major portion of each Hall cell (e.g. in pocket 28) to keep the surface of the Hall cell surface below at a constant potential which stabilizes the surface electrically and leads to a lower more predictable offset voltage.

What is claimed is:

1. A silicon integrated circuit chip comprising a semiconductor substrate of one conductivity type, an epitaxial layer of the opposite conductivity type on one face of said substrate, a Hall element disposed in a central portion of the outer surface of said epitaxial layer, an amplifier circuit including a plurality of bipolar transistor, another portion of said epitaxial layer surrounding said Hall element containing a network of opposite-conductivity-type isolation walls forming a plurality of PN junction isolated pockets of one conductivity type, said transistors occupying at least some of said pockets, said Hall element being separated from the adjacent of said pockets by a moat surrounding said Hall element, said moat being comprised of two concentric spaced apart heavily doped isolation walls of said one conductivity type, said concentric isolation walls each having at least one downward diffused portion from said surface, the span of said moat at said surface being greater than three times the thickness of said epitaxial layer to isolate said Hall element from built-in stresses in said surrounding epitaxial layer portion adjacent to said Hall element.

2. The integrated circuit of claim wherein said Hall element is comprised of an array of four Hall cells having their outputs connected in parallel, said cells being separated by a system of uniformly wide heavily doped isolation walls.

3. The integrated circuit of claim 2 wherein said walls of said system of walls are uniformly wide and all of the same width.

4. The integrated circuit of claim 3 wherein at least one wall of said moat has one uniform width around said Hall element and said wall width of said system of walls and said width of said at least one wall of said moat are all the same width.

5. The integrated circuit of claim 2 additionally comprising a network of conductors adjacent to said surface for making electrical connections between said amplifier and the output of said Hall element and for providing a means for connecting said power contacts to a DC source of energy.

6. The integrated circuit of claim 5 wherein there is a metal sheet portion of said network of conductors extending over a major portion of the area of said Hall cells.

7. The integrated circuit of claim 1 wherein the opposite-conductivity-type region in said moat between said spaced apart concentric walls is uniformly wide.

8. The integrated circuit of claim 7 wherein said moat region of opposite conductivity type is about 25 microns wide.

9. The integrated circuit of claim 2 wherein said system of walls merges with the innermost of said concentric walls.

10. The integrated circuit of claim 2 wherein said Hall element includes at least two power contacts for connection to an electrifying source of DC voltage, and additionally comprising a bridge region of one conductivity type in said moat for physically and electrically joining said concentric walls and being located near one of said power contacts.

* * * * *